(12) United States Patent
Shen et al.

(10) Patent No.: US 10,406,693 B2
(45) Date of Patent: Sep. 10, 2019

(54) SUBSTRATE TRANSFER ROBOT

(71) Applicants: Boe Technology Group Co., Ltd., Beijing (CN); Hefei Xinsheng Optoelectronics Technology Co., Ltd., Anhui (CN)

(72) Inventors: Erfeng Shen, Beijing (CN); Jie Wang, Beijing (CN); Qingshuang Ren, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/838,082

(22) Filed: Dec. 11, 2017

(65) Prior Publication Data

US 2018/0264654 A1    Sep. 20, 2018

(30) Foreign Application Priority Data

Mar. 14, 2017    (CN) .................... 2017 2 0249214 U

(51) Int. Cl.
| | |
|---|---|
| *B25J 9/04* | (2006.01) |
| *B25J 11/00* | (2006.01) |
| *B25J 9/00* | (2006.01) |
| *H01L 21/677* | (2006.01) |
| *B25J 13/08* | (2006.01) |

(52) U.S. Cl.
CPC ......... *B25J 11/0095* (2013.01); *B25J 9/0009* (2013.01); *B25J 9/0087* (2013.01); *H01L 21/67742* (2013.01); *B25J 9/042* (2013.01); *B25J 13/088* (2013.01); *G05B 2219/45031* (2013.01)

(58) Field of Classification Search
CPC .......... B25J 9/042; B25J 9/043; B25J 13/088
See application file for complete search history.

(56) References Cited

U.S. PATENT DOCUMENTS

| | | | | |
|---|---|---|---|---|
| 2013/0121798 A1* | 5/2013 | Hosek | ................... | H01L 21/677 414/744.5 |
| 2013/0345874 A1* | 12/2013 | Blumberg | .............. | B25J 9/0087 700/259 |
| 2016/0136818 A1* | 5/2016 | Kitahara | ................ | B65G 47/90 414/222.07 |

* cited by examiner

*Primary Examiner* — Gerald McClain
(74) *Attorney, Agent, or Firm* — Womble Bond Dickinson (US) LLP

(57) ABSTRACT

A substrate transfer robot includes a base, a column provided on the base, a number of robotic arm groups protruding from the column in different directions. Each of the number of robotic arm groups includes at least one robotic arm and elevating mechanisms. The elevating mechanisms correspond to the robotic arm groups one by one and are fixedly connected to the robotic arm groups. The number of robotic arm groups can be driven by the respective elevating mechanisms, to move in a longitudinal direction of the column respectively. The substrate transfer robot can improve the handling efficiency.

17 Claims, 6 Drawing Sheets

SUBSTRATE TRANSFER ROBOT

RELATED APPLICATION

The present application claims the priority of Chinese patent application No. 201720249214.1 filed on Mar. 14, 2017, which is incorporated herein by reference in its entirety.

FIELD OF THE INVENTION

The present disclosure relates to a field of display technology, and more particularly to a substrate transfer robot.

BACKGROUND OF THE INVENTION

Robot is a machine that can work automatically, which not only can work under a command from human, but also can run pre-programmed programs as well as perform according to rules formulated based on artificial intelligence technology, in order to assist or replace human to work in production. In the LCD (Liquid Crystal Display) manufacturing industry, substrate transferring is widely performed by substrate transfer robots.

The substrate transfer robot includes a control module and robotic arms. Under the control of the control module, the robotic arm can be inserted under a substrate and the substrate can be fixed on the robotic arm and then transferred.

The working flow of the substrate transfer robot is as follows: after the robotic arm picks up a substrate at the pick-up position, it rotates to place the substrate at the other side and then rotates back to the original pick-up position to pick up a next substrate, and the process will be cyclically carried out. However, the handling efficiency of the substrate transfer robot is low so that when mass production is needed and the production time is limited, the number of the substrate transfer robots or the working period of the substrate transfer robot must be increased in order to complete the task.

However, by increasing the number of the substrate transfer robots, additional devices need to be purchased. Besides, more space will be occupied. Therefore, the cost will be increased. Increasing the daily working period of the substrate transfer robot can easily cause excessive fatigue of the substrate transfer robot, thereby affecting the usage life of the substrate transfer robot.

SUMMARY OF THE INVENTION

An embodiment of the present disclosure provides a substrate transfer robot comprising: a base; a column provided on the base; a plurality of robotic arm groups protruding from the column in different directions, each of the robotic arm groups including at least one robotic arm; and, elevating mechanisms corresponding to the robotic arm groups one by one and fixedly connected with the robotic arm groups; wherein the plurality of robotic arm groups can be driven by the respective elevating mechanisms to move in the longitudinal direction of the column, respectively.

Exemplarily, each of the elevating mechanisms includes a first mandrel fixed in the column, a first mandrel sleeve sleeved on the first mandrel and a first control means connected to the first mandrel sleeve; the axial direction of the first mandrel is coincident with the longitudinal direction of the column; and the first control means is used to control the movement of the first mandrel sleeve along the axial direction of the first mandrel, wherein the robotic arm group is connected to the first mandrel sleeve.

Exemplarily, the elevating mechanism includes a first mandrel fixed in the column, a first mandrel sleeve sleeved on the first mandrel, and a first control means connected to the first mandrel sleeve, a movable member connected to the first mandrel sleeve and located outside the column, a second mandrel fixed in the movable member, a second mandrel sleeve sleeved on the second mandrel, and a second control means connected to the second mandrel sleeve; the movable member has a hollow interior, the axial directions of the first mandrel and the second mandrel are coincident with the extending direction of the column, the first control means is configured to control the movement of the first mandrel sleeve along the axial direction of the first mandrel, the second control means is configured to control the movement of the second mandrel sleeve along the axial direction of the second mandrel; wherein the robotic arm group is connected to the second mandrel sleeve.

According to an aspect of the present disclosure, the elevating mechanism further comprises a third control means connected with the first mandrel sleeve, the lower end face of the first mandrel sleeve is closer to the base than the lower end face of the movable member; when the first control means controls the first mandrel sleeve to move upward, the movable member will be driven to move upward together, and when the lower end face of the movable member is flush with or beyond the upper end face of the column, the third control means can control the first mandrel sleeve to rotate.

According to an aspect of the present disclosure, the column is a square prism; wherein the substrate transfer robot comprises two robotic arm groups, and the two robotic arm groups are driven by the two elevating mechanisms connected thereto to move up and down along adjacent two sides of the column respectively.

According to an aspect of the present disclosure, each of the robotic arm groups comprises two robotic arms.

According to an aspect of the present disclosure, the robotic arm includes a plurality of sub-arms, and the two adjacent sub-arms are movably connected, and each sub-arm can rotate parallel to the base.

According to an aspect of the present disclosure, the substrate transfer robot further comprises a rotating shaft provided at the center of the base, the rotating shaft being connected to the column for driving the column to rotate, wherein the axial direction of the rotating shaft is coincident with the longitudinal direction of the column.

According to an aspect of the present disclosure, the substrate transfer robot further comprises a connecting rod whose longitudinal direction extending perpendicularly to an axial direction of the rotating shaft, one end of the connecting rod is connected with the rotating shaft and the other end is connected with the column; wherein the column is disposed on a surface of the connecting rod away from the base.

According to an aspect of the present disclosure, the robotic arm group includes a fixed base, and the robotic arm group is fixedly connected with the elevating mechanism through the fixed base.

An embodiment of the present disclosure provides a substrate transfer robot, wherein a plurality of robotic arm group are provided on the substrate transfer robot and elevating mechanisms are provided corresponding to the plurality of robotic arm groups one by one and fixedly connected with the plurality of robotic arm groups. In the operation of the substrate transfer robot, a first elevating mechanism control a robotic arm group to raise to a certain height and pick up a substrate, then the first elevating mechanism controls the robotic arm group to rotate to another side to place the substrate. While the first elevating mechanism controls the robotic arm group to rotate to another side to place the substrate, a second elevating mechanism can control another robotic arm group to pick up a substrate. When the first elevating mechanism controls the robotic arm group to rotate back to its original pick-up position to pick up a next substrate, the second elevating mechanism can control the another robotic arm group to rotate to the other side to place the substrate. In this way, the plurality of elevating mechanisms in the present disclosure can drive the plurality of robotic arm groups to work simultaneously. Compared to the prior art wherein there is only one elevating mechanism to drive one robotic arm group to work, the handling efficiency of the substrate transfer robot can be increased without increasing the production cost or shortening the usage life of the substrate transfer robot.

BRIEF DESCRIPTION OF THE DRAWINGS

In order to more clearly illustrate the technical solution in the present embodiment of the present disclosure, the drawings used in the present embodiment of the present disclosure will be briefly described below. It will be apparent that the drawings in the following description are merely illustrative of some embodiments of the present disclosure and for those ordinarily skilled in the art, other drawings can be made without any creative effort based on these drawings.

DETAILED DESCRIPTION OF THE INVENTION

The embodiments of the present disclosure will now be described thoroughly and clearly in conjunction with the accompanying drawings in the present disclosure, and it will be apparent that the described embodiments are merely part of the embodiments of the present disclosure and not all of the embodiments. All other embodiments obtained by those ordinarily skilled in the art based on the embodiments of the present disclosure without creative work are within the scope of this disclosure.

Figure 1:
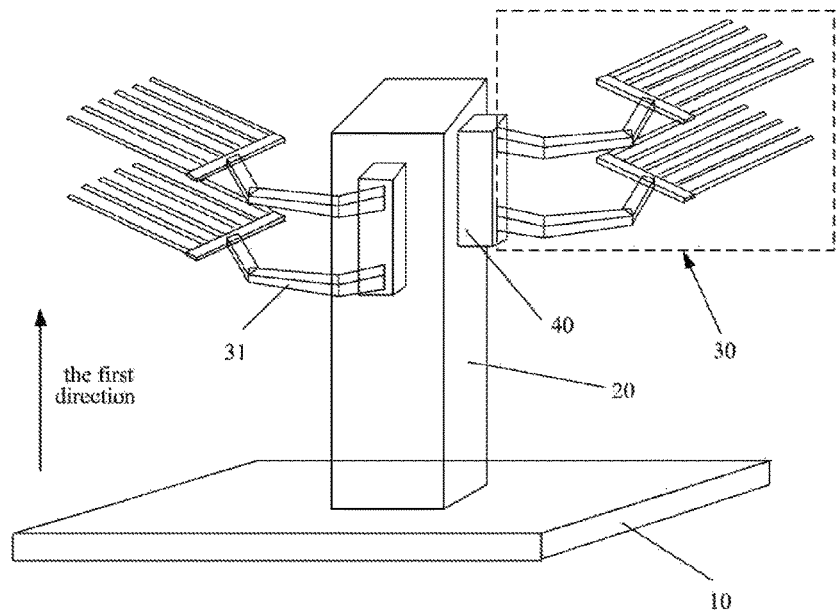
FIG. 1 is a first schematic structural view of a substrate transfer robot provided by an embodiment of the present disclosure.

An embodiment of the present disclosure provides a substrate transfer robot, as shown in FIG. 1, comprising: a base 10; a column 20 provided on the base 10; a plurality of robotic arm groups 30 protruding from the column 20 in different directions; elevating mechanisms 40 corresponding to the robotic arm groups 30 one by one and fixedly connected to the robotic arm groups 30; wherein the plurality of robotic arm groups 30 can be driven by the respective elevating mechanisms 40 to move in a longitudinal direction (the first direction in FIG. 1) of the column 20, respectively, wherein each of the robotic arm groups 30 includes at least one robotic arm 31.

Figure 2:
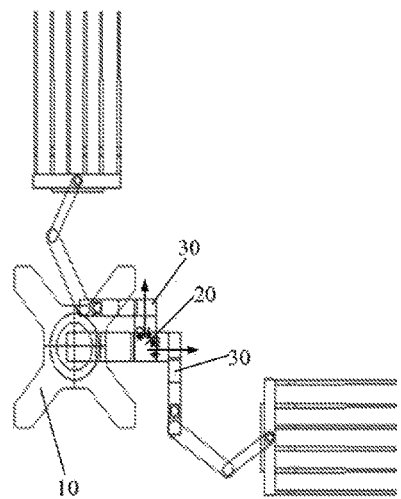
FIG. 2 is a schematic top view of a substrate transfer robot provided by an embodiment of the present disclosure.

It is to be noted that, first, each of the robotic arm groups 30 comprises at least one robotic arm 31. As shown in FIG. 1, each of the robotic arm groups 30 comprises two robotic arms 31, wherein two robotic arms 31 in the same robotic arm group 30 protrude in the same direction outward from the column 20. The protruding direction of the robotic arm group 30 outward from the column 20 is a longitudinal extending direction of a root (that is, the first section of the robotic arm 31 extending from the elevating mechanism 40, i.e., the section away from the substrate picking up section) of the robotic arm 31. As shown in FIG. 2, the two robotic arm groups 30 protrude outwardly from the column 20 in the direction indicated by the arrows in FIG. 2, respectively.

Second, the plurality of robotic arm groups 30 can be located on the same surface of the column 20 and protrude in different directions, or alternatively they can also be located on different surfaces and protrude in different directions. Each of the robotic arm groups 30 can be driven up and down by an elevating mechanism 40. In FIG. 1, only by illustration, the substrate transfer robot includes two robotic arm groups 30, and the two robotic arm groups 30 are located in two adjacent surfaces of the column 20, respectively.

Thirdly, when the plurality of elevating mechanisms 40 drive the arm groups 30 connected thereto in the extending direction of the column 20, the plurality of elevating mechanisms 40 can move synchronously or can move non-synchronously (asynchronously). The plurality of robotic arms 31 within the same robotic arm group 30 are moved synchronously.

Fourth, the elevating mechanism 40 can be provided inside the column 20 or as shown in FIG. 1 can be provided outside the column 20, and the robotic arm group 30 can be driven by the elevating mechanism 40 to move up and down along different surfaces of the column 20.

Fifth, the shape of the column 20 is not specifically restricted, and the quadrangular prism shape of the column 20 in FIGS. 1 and 2 is only schematic.

An embodiment of the present disclosure provides a substrate transfer robot in which a plurality of robotic arm groups 30 are provided on the substrate transfer robot and a plurality of elevating mechanisms 40 are provided corresponding to the robotic arm groups 30 one by one and fixedly connected to the robotic arm groups 30. In the operation of the substrate transfer robot, a first elevating mechanism 40 controls a robotic arm group 30 to raise to a certain height and pick up a substrate, then the first elevating mechanism 40 controls the robotic arm group 30 to rotate to another side to place the substrate. While the first elevating mechanism 40 controls the robotic arm group 30 to rotate to another side to place the substrate, a second elevating mechanism 40 can control another robotic arm group 30 to pick up a substrate. When the first elevating mechanism 40 controls the robotic arm group 30 to rotate back to its original pick-up position to pick up a next substrate, the second elevating mechanism 40 can control the another robotic arm group 30 to rotate to the other side to place the substrate. In this way, the plurality of elevating mechanisms 40 in the present disclosure can drive the plurality of robotic arm groups 30 to work simultaneously. Compared to the prior art wherein there is only one elevating mechanism 40 to drive one robotic arm group 30 to work, the handling efficiency of the substrate transfer robot can be increased without increasing the number of the substrate transfer robots or shortening the usage life of the substrate transfer robot.

Further, by controlling the robotic arm group 30 to move up and down by the elevating mechanism 40, the substrate transfer robot is capable to pick up substrates at different heights, thereby increasing the applicable range of the substrate transfer robot.

Figure 3:
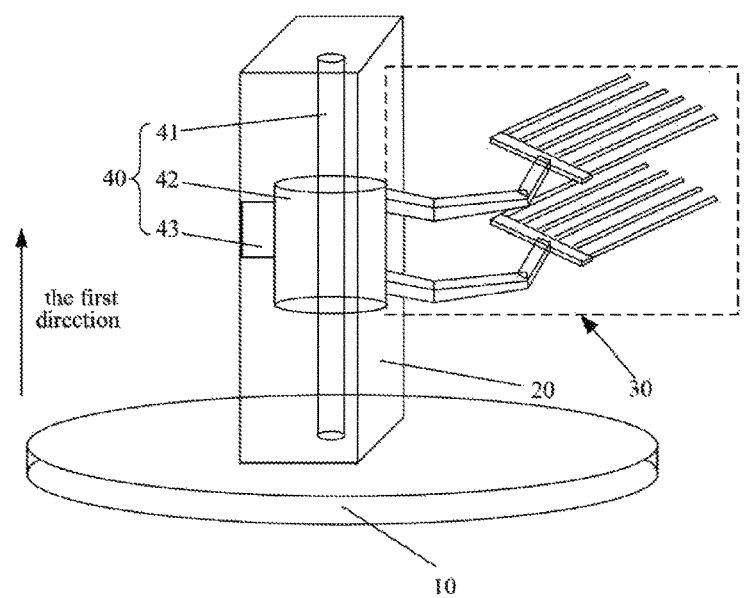
FIG. 3 is a second schematic structural view of a substrate transfer robot provided by an embodiment of the present disclosure.

Exemplarily, as shown in FIG. 3, each of the elevating mechanisms 40 includes a first mandrel 41 fixed in the column 20, a first mandrel sleeve 42 sleeved on the first mandrel 41 and a first control means 43 connected to the first mandrel sleeve 42; the axial direction of the first mandrel 41 is coincident with the longitudinal direction of the column 20; and the first control means 43 is used to drive the first mandrel sleeve 42 to move along the axial direction of the first mandrel 41, wherein the robotic arm group 30 is connected with the first mandrel sleeve 42. In FIG. 3, only one of the elevating mechanisms 40 in the substrate transfer robot is shown for schematic illustration.

It will be appreciated by those ordinarily skilled in the art that the first mandrel 41 is located within the column 20 and the first mandrel sleeve 42 is also located within the column 20. The first mandrel sleeve 42 is controlled by the first control means 43 to drive the robotic arm group 30 connected thereto to move in a first direction on the surface of the column 20. The surface of the column 20 corresponding to the robotic arm group 30 is provided with a structure like chute so that the robotic arm group 30 can move along the surface of the column.

In addition, the first control means 43 can be for example a motor, and a control chip can be used to control the motor to drive the first mandrel sleeve 42 to move in the first direction through a lead screw transmission mechanism.

In the embodiment of the present disclosure, the first mandrel sleeve 43 sleeved on the first mandrel 41 can be controlled by the first control means 43 to drive the robotic arm group 30 to move in the first direction, so that the movement trajectory of the first mandrel sleeve 42 can be restricted by the first mandrel 41 to a certain extent, avoiding the happening of the offset of the first mandrel sleeve 42 and the influencing to the movement accuracy of the robotic arm group 30.

Figure 4:
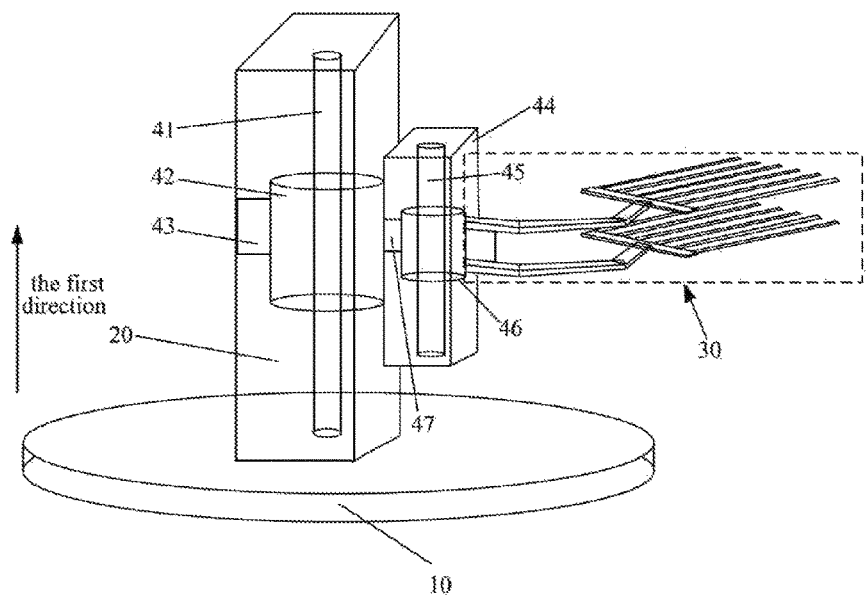
FIG. 4 is a third schematic structural view of a substrate transfer robot provided by an embodiment of the present disclosure.

Exemplarily, as shown in FIG. 4, the elevating mechanism 40 may include a first mandrel 41 fixed in the column 20, a first mandrel sleeve 42 sleeved on the first mandrel 41, and a first control means 43 connected to the first mandrel sleeve 42, a movable member 44 connected to the first mandrel sleeve 42 and located outside the column 20, a second mandrel 45 fixed in the movable member 44, a second mandrel sleeve 46 sleeved on the second mandrel 45, and a second control means 47 connected to the second mandrel sleeve 46; wherein the movable member 44 has a hollow interior, the axial directions of the first mandrel 41 and the second mandrel 45 are coincident with the extending direction of the column 20, the first control means 43 is configured to control the movement of the first mandrel sleeve 42 along the axial direction of the first mandrel 41, the second control means 47 is configured to control the movement of the second mandrel sleeve 46 along the axial direction of the second mandrel 45; wherein the robotic arm group 30 is connected to the second mandrel sleeve 46.

As shown in FIG. 4, the movement of the robotic arm group 30 in the first direction can be realized by the cooperation of the first control means 43 and the second control means 47. Specifically, the second control means 47 can be stationary, while the first control means 43 drives the first mandrel sleeve 42 to move in the first direction so as to drive the movable member 44 to move in the first direction, thereby driving the robotic arm group 30 connected with the movable member 44 to move in the first direction. Alternatively, it is possible that the first control means 43 can be stationary, while the second mandrel means 46 can drive the second mandrel sleeve 46 to move in the first direction, thereby driving the robotic arm group 30 connected thereto to move in the first direction. Of course, it is also possible that the first control means 43 can drive the first mandrel sleeve 42 to move to the uppermost position in the first direction, and the movable member 44 connected thereto has also moved to its uppermost position. On this basis, the second mandrel sleeve 46 can be driven by the second control means 47 to move in the first direction, thereby driving the arm assembly 30 connected thereto to move in the first direction.

In addition, the first control means 43 and the second control means 47 in the same elevating mechanism 40 can be controlled by a same control chip or can be controlled by separate control chips respectively.

Figure 5:
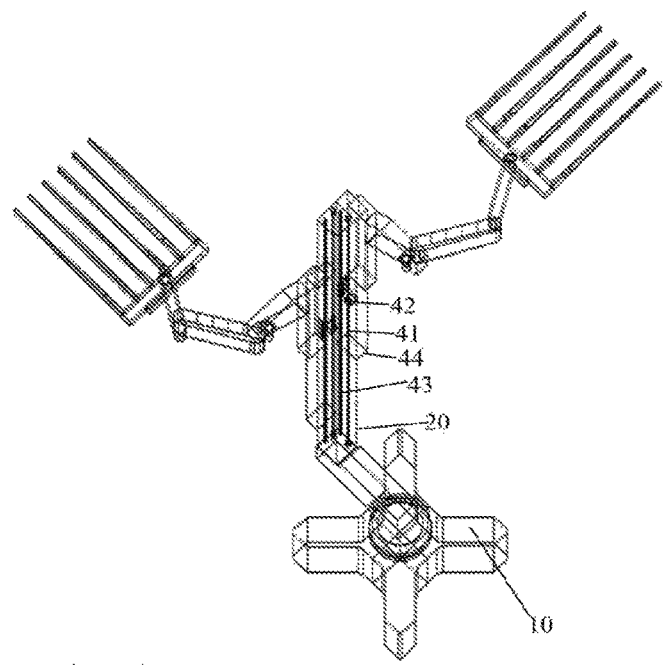
FIG. 5 is a fourth schematic structural view of a substrate transfer robot provided by an embodiment of the present disclosure.

Furthermore, as an extension to the solution where there is only one first mandrel 41 in the column 20, as shown in FIG. 5, a plurality of first mandrels 41 of the plurality of elevating mechanisms 40 can be provided in the column 20 (for example, as shown in FIG. 5, there are two elevating mechanisms 40, and correspondingly, there are two first mandrels 41 in the column 20), and the movable members 44 are located on different surfaces of the column 20. The first control means 43 and the second control means 47 in different elevating mechanisms 40 can be controlled by a same control chip or controlled by separate control chips respectively.

In this case, as the mandrel becomes longer, it will become more unstable. The liquid crystal semiconductor industry demands very high accuracy, requiring both high stability and high accuracy. In this embodiment, by providing two mandrels, the first mandrel 41 is a main mandrel, and the second mandrel 45 is an auxiliary mandrel to raise the robotic arm group 30 to a higher height, which can make the robotic arm group 30 more stable after raising to a higher position, without causing tilting due to rising too high, so that the substrate pick-up accuracy can be ensured.

Figure 6:
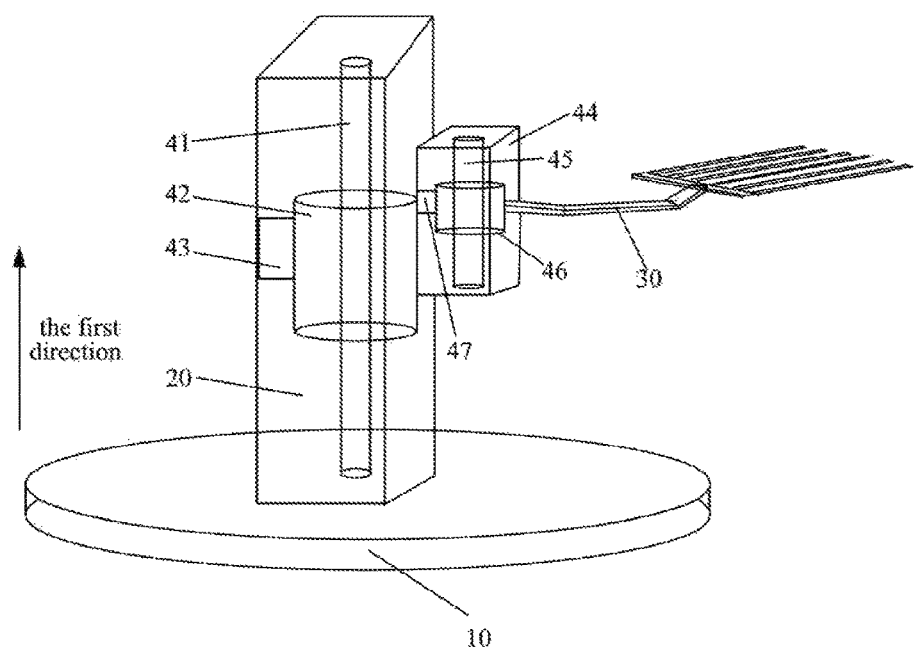
FIG. 6 is a fifth schematic structural view of a substrate transfer robot provided by an embodiment of the present disclosure.
Figure 7:
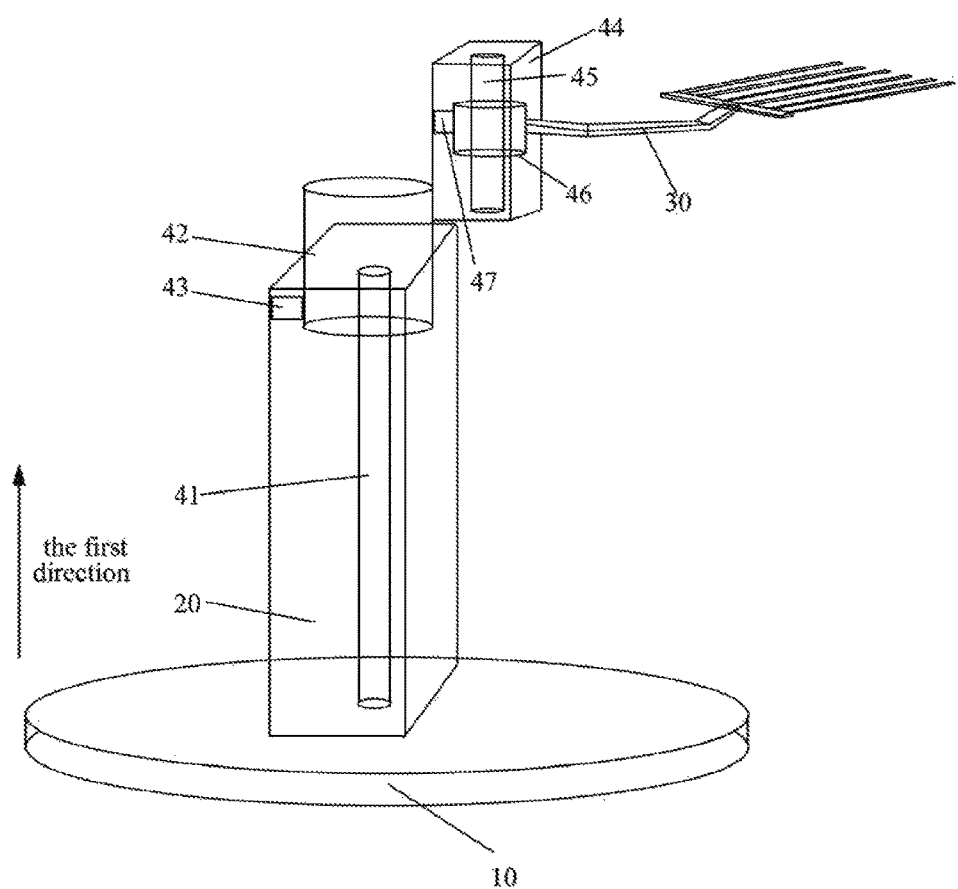
FIG. 7 is a sixth schematic structural view of a substrate transfer robot provided by an embodiment of the present disclosure.

According to an aspect of the present disclosure, the elevating mechanism 40 further comprises a third control means (not shown) connected with the first mandrel sleeve 42. As shown in FIG. 6, the lower end face of the first mandrel sleeve 42 is closer to the base 10 than the lower end face of the movable member 44. When the first control means 43 controls the first mandrel sleeve 42 to move upward, it will drive the movable member 44 to move upward together. As shown in FIG. 7, when the lower end face of the movable member 44 is flush with or beyond the upper end face of the column 20, the third control means can control the first mandrel sleeve 42 to rotate.

As shown in FIG. 6, when the surface of the base 10 is planar, the statement that the lower end face of the first mandrel sleeve 42 is closer to the base 10 than the lower end face of the movable member 44 means the distance from the lower end of the first mandrel sleeve 42 to the base is smaller than the distance from the lower end face of the movable member 44 to the base 10. Here, the lower end face of the first mandrel sleeve 42 refers to the end face of the first mandrel sleeve 42 near the base 10, and the lower end face of the movable member 44 refers to the end face of the movable member 44 near the base 10.

In addition, it will be understood by those ordinarily skilled in the art that the first control means 43 can control the first mandrel sleeve 42 to move upward and when the lower end face of the movable member 44 is flush with or beyond the upper end face of the column 20, the first mandrel sleeve 42 should still be sleeved on the first mandrel 41. At this time, the first mandrel sleeve 42 can be controlled by the third control means to rotate, that is, the first mandrel sleeve 42 can be rotated in the direction parallel to the end face of the first mandrel 41 so that the bottom face of the movable member 44 is at least partially located on the top face of the column 20.

In the embodiment of the present disclosure, after the movable member 44 is moved to the uppermost position, the first mandrel sleeve 42 can be controlled by the third control means to rotate, and drive the movable member 44 to rotate to the upper end of the column 20, so that the bottom face of the movable member 44 can be at least partially located on the top face of the column 20 so as to provide a support force to the movable member 44, thereby further increasing the stability of the elevating mechanism 40.

According to an aspect of the present disclosure, as shown in FIG. 1, FIG. 2 and FIG. 5, the column 20 is a square prism; the substrate transfer robot includes two robotic arm groups 30, and the two robotic arm groups 30 can be driven by the elevating mechanism 40 connected thereto to move up and down along two adjacent side faces of the column 20. That is, the substrate transfer robot includes two elevating mechanisms 40 and two robotic arm groups 30.

In order to further improve the handling efficiency, furthermore, as shown in FIGS. 1, 3 and 4, each of the robotic arm groups 30 includes two mechanical arms. Wherein the two robotic arms 31 within one of the robotic arm groups 30 are moved synchronously.

Figure 8:
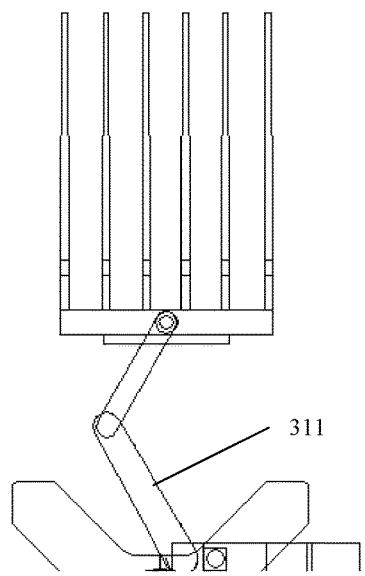
FIG. 8 is a schematic structural view of a mechanical arm provided by an embodiment of the present disclosure.

According to an aspect of the present disclosure, as show in FIG. 8, each of the robotic arms 31 includes a plurality of sub-arms 311, wherein adjacent two sub-arms 311 are movably connected, and each of the sub-arms 311 can rotate parallel to the base 10. Wherein the number of the sub-arms 311 is not restricted, for example, each of the robotic arms 31 may include three sub-arms 311.

In the embodiment of the present disclosure, because one robotic arm 31 includes a plurality of sub-arms 311, a 360° rotation of the robotic arm 31 during the operation of the substrate transfer robot can be achieved by controlling the movement and rotation of the sub-arms 311.

Figure 9:
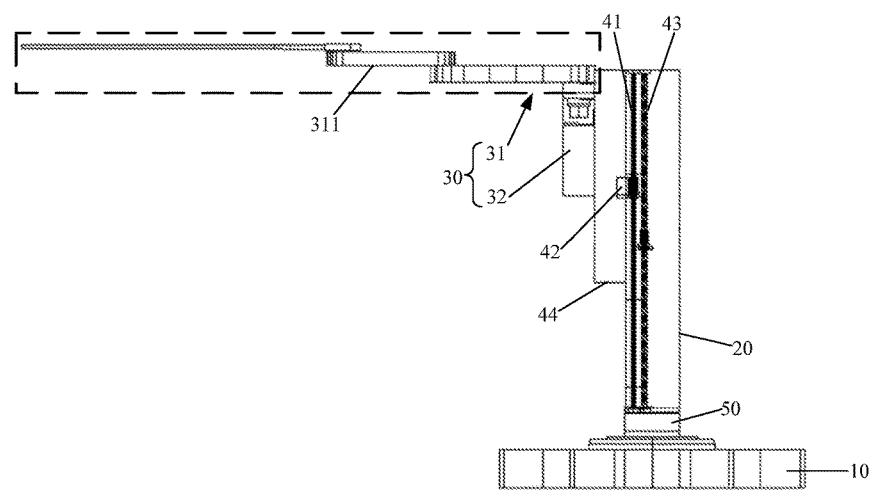
FIG. 9 is a schematic side view of a substrate transfer robot provided by an embodiment of the present disclosure.

According to an aspect of the present disclosure, as shown in FIG. 9, the substrate transfer robot further includes a rotating shaft 50 provided at the center of the base 10, and the rotating shaft 50 is connected with the column 20 for driving the column 20 to rotate, wherein the axial direction of the rotating shaft 50 is coincident with the extending direction of the column 20.

In the present embodiment, by providing the rotating shaft 50 at the center of the base 10, the column 20 can rotate integrally to drive the robotic arm 31 to rotate so that the rotation of the substrate transfer robot can be more flexible so as to realize picking and placing the substrate 10 at different orientations and positions.

Figure 10:
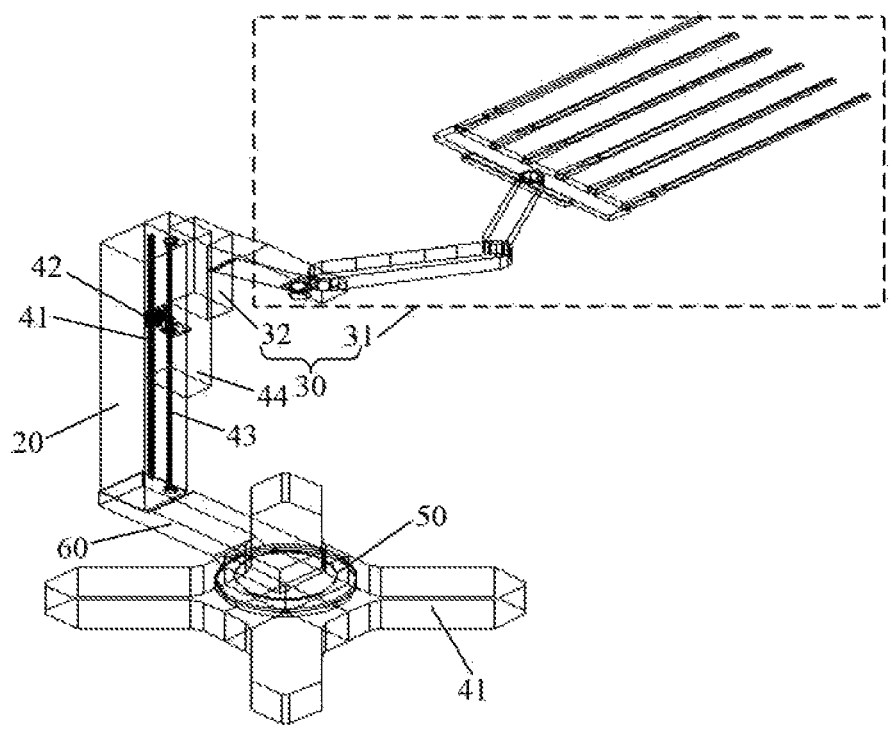
FIG. 10 is a seventh schematic structural view of a substrate transfer robot provided by an embodiment of the present disclosure.

According to an aspect of the present disclosure, as shown in FIG. 10, the substrate transfer robot further includes a connecting rod 60, wherein the longitudinal direction of the connecting rod 60 is perpendicular to the axial direction of the rotating shaft 50. One end of the connecting rod 60 is connected with the rotating shaft 50 and the other end of the connecting rod 60 is connected with the column 20, wherein the column 20 is provided on the surface of the connecting rod 60 away from the base 10. The connecting rod 60 can be a regular shaped structure such as a flat bar or a cylindrical bar, or can be an irregular shaped structure. Due to the presence of the connecting rod 60, the movement of the substrate transfer robot can be more flexible so as to realize picking and placing the substrate 10 at different orientations and positions.

As shown in FIG. 10, the surface of the connecting rod 60 away from the base 10 is the upper surface of the connecting rod 60.

According to an aspect of the present disclosure, as shown in FIGS. 9 and 10, the robotic arm group 30 further includes a fixing base 32. The robotic arm group 30 is fixedly connected with the elevating mechanism 40 through the fixing base 32. By connecting the robotic arm 31 with the elevating mechanism 40 by using the fixing base 32, it is possible to adjust the positional relationship between the robotic arms 31 thereby to further improve the applicable range of the substrate transfer robot.

Finally, it should be noted that the phrases "a", "an" used in the claims do not exclude the plural and they are intended to be merely illustrative and should not be construed as limiting the scope of the invention.

The term "about" as used in this specification refers to a deviation of +/−15% from the nominal value. It should be understood that such deviations are always included in any given value in this specification, whether or not explicitly stated.

Unless otherwise defined, all technical and scientific terms used in this specification have the same meaning as commonly understood by those skilled in the art to which this invention pertains.

The foregoing description is merely specific embodiments of the present disclosure, but the scope of protection of the present disclosure is not limited thereto, and any one ordinarily skilled in the art will be able to easily think of variations or substitutions within the technical scope disclosed in this disclosure. And all those variations or substitutions are covered by the scope of the present disclosure. Accordingly, the scope of protection of the present disclosure is defined by the scope of protection of the claims.

The invention claimed is:

1. A substrate transfer robot comprising:
   a base
   a column provided on the base;
   a plurality of robotic arm groups protruding from the column in different directions, each of the robotic arm groups comprising at least one robotic arm; and
   elevating mechanisms corresponding to the robotic arm groups one by one and fixedly connected to the robotic arm groups;
   wherein the plurality of robotic arm groups can be driven by the respective elevating mechanisms to move in a longitudinal direction of the column, respectively,
   wherein the elevating mechanism comprises a first mandrel fixed in the column, a first mandrel sleeve sleeved on the first mandrel, a first control means connected to the first mandrel sleeve, the first control means is configured to control a movement of the first mandrel sleeve along an axial direction of the first mandrel, first control means is a first motor controlled by a control chip to drive the first mandrel sleeve to move along the axial direction of the first mandrel through a first lead screw transmission mechanism, and wherein at least part of the plurality of robotic arm groups are fixed to the first mandrel sleeve.

2. The substrate transfer robot according to claim 1, wherein each of the elevating mechanisms comprises a first mandrel fixed in the column, a first mandrel sleeve sleeved on the first mandrel and a first control means connected to the first mandrel sleeve;

an axial direction of the first mandrel is coincident with the longitudinal direction of the column; and the first control means is used to control a movement of the first mandrel sleeve along the axial direction of the first mandrel, wherein the robotic arm group is connected to the first mandrel sleeve.

3. The substrate transfer robot according to claim 1, wherein the elevating mechanism further includes a movable member connected to the first mandrel sleeve and located outside the column, a second mandrel fixed in the movable member, a second mandrel sleeve sleeved on the second mandrel, and a second control means connected to the second mandrel sleeve;

the movable member has a hollow interior, axial directions of the first mandrel and the second mandrel are coincident with an extending direction of the column, the second control means is configured to control a movement of the second mandrel sleeve along an axial direction of the second mandrel, the second control means is a second motor controlled by the control chip to drive the second mandrel sleeve to move along the axial direction of the second mandrel through a second lead screw transmission mechanism;

wherein the robotic arm group is connected to the second mandrel sleeve.

4. The substrate transfer robot according to claim 3, wherein the elevating mechanism further comprises a third control means connected with the first mandrel sleeve, the third control means is a third motor controlled b the control chip, a lower end face of the first mandrel sleeve is closer to the base than a lower end face of the movable member, when the first control means controls the first mandrel sleeve to move upward, said first control means will drive the movable member to move upward together with the first mandrel sleeve, and when the lower end face of the movable member is flush with or beyond the upper end face of the column, the third motor controls the first mandrel sleeve to rotate.

5. The substrate transfer robot according to claim 1, wherein the elevating mechanism is provided inside the column.

6. The substrate transfer robot according to claim 1, wherein each of the robotic arm groups comprises two robotic arms.

7. The substrate transfer robot according to claim 6, wherein the robotic arm each includes a plurality of sub-arms, and adjacent two sub-arms are movably connected to each other, and each sub-arm can rotate parallel to the base.

8. The substrate transfer robot according to claim 1, further comprising a rotating shaft provided at a center of the base, the rotating shaft being connected to the column for driving the column to rotate, wherein an axial direction of the rotating shaft is coincident with the longitudinal direction of the column.

9. The substrate transfer robot according to claim 8, further comprising a connecting rod whose longitudinal direction extending perpendicularly to the axial direction of the rotating shaft, one end of the connecting rod is connected with the rotating shaft and the other end is connected with the column;

wherein the column is disposed on a surface of the connecting rod away from the base.

10. The substrate transfer robot according to claim 1, wherein the robotic arm group includes a fixed base, and the robotic arm group is fixedly connected with the elevating mechanism through the fixed base.

11. The substrate transfer robot according to claim 1, wherein each of the robotic arm groups includes a plurality of robotic arms and the plurality of robotic arms in the same robotic arm group protrude in the same direction outward from the column.

12. The substrate transfer robot according to claim 1, wherein the elevating mechanism is provided outside the column.

13. The substrate transfer robot according to claim 1, wherein the plurality of elevating mechanisms synchronously drive the arm groups connected thereto to move in the longitudinal direction of the column, respectively.

14. The substrate transfer robot according to claim 1, wherein the plurality of elevating mechanisms asynchronously drive the robotic arm groups connected thereto to move along the longitudinal direction of the column respectively.

15. The substrate transfer robot according to claim 14, wherein the robotic arms in the same robotic arm group are moved synchronously.

16. The substrate transfer robot according to claim 1, wherein the column is a square prism;

the substrate transfer robot comprises two robotic arm groups, and the two robotic arm groups are driven by two elevating mechanisms connected thereto to move up and down along adjacent two sides of the column respectively.

17. The substrate transfer robot according to claim 16, wherein the plurality of robotic arm groups are located on the same surface of the column and protrude in different directions; or the plurality of robotic arm groups are located on different surfaces of the column and protrude in different directions.

* * * * *